(12) United States Patent
Cline

(10) Patent No.: US 6,504,372 B1
(45) Date of Patent: Jan. 7, 2003

(54) HIGH FIELD OPEN MAGNETIC RESONANCE MAGNET WITH REDUCED VIBRATION

(75) Inventor: Harvey Ellis Cline, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/683,415

(22) Filed: Dec. 24, 2001

(51) Int. Cl.⁷ .................................................. G01V 3/00
(52) U.S. Cl. ........................................ 324/319; 324/320
(58) Field of Search ................................. 324/319, 320, 324/318, 300, 306, 307, 309, 312, 314

(56) References Cited

U.S. PATENT DOCUMENTS

| | | | | |
|---|---|---|---|---|
| 5,623,241 A | * | 4/1997 | Minkoff | 324/319 |
| 6,014,070 A | * | 1/2000 | Danby et al. | 324/319 |
| 6,169,404 B1 | * | 1/2001 | Eckels | 324/318 |
| 6,172,588 B1 | | 1/2001 | Laskaris et al. | 335/299 |
| 6,340,888 B1 | * | 1/2002 | Aoki et al. | 324/319 |

* cited by examiner

Primary Examiner—Louis Arana
(74) Attorney, Agent, or Firm—Jean K. Testa; Patrick K. Patnode

(57) ABSTRACT

A magnet assembly system for use in an open Magnetic Resonance Imaging (MRI) system comprises a first assembly and a second assembly opposing each other in a longitudinally spaced apart relationship. The first and second assemblies generate a static magnetic field for use in imaging. Further provided is a plurality of support posts attached between the first and second assemblies for maintaining an open imaging volume between the first and second assemblies and for further providing structural support. Each of the support posts comprises a first support element and a second support element attached to first support element on the surface away from the imaging volume. A method for reducing vibration in an open MRI system comprises attaching a second support element to each of the support posts on a surface away from the imaging volume.

10 Claims, 3 Drawing Sheets

HIGH FIELD OPEN MAGNETIC RESONANCE MAGNET WITH REDUCED VIBRATION

BACKGROUND OF THE INVENTION

This invention relates generally to an open magnetic resonance imaging (MRI) magnet system, and more particularly to the support structures contained within the open magnet assembly.

Open MRI magnets are generally made with two magnetic pole pieces in the shape of thick disks. For a horizontal open magnet, the pole pieces are arranged with an upper horizontal pole and a lower horizontal pole. The imaging subject is inserted in the gap between the poles. Another arrangement has the planes of the pole pieces (often referred to as "double donut") with the patient inserted through holes in the center of the pole pieces (the "donut holes"). In this arrangement, a physician or other attendant can stand between the donuts and thereby have access to the patient.

Typically, there are strong magnetic forces between the pole pieces and, in the case of the horizontal magnet arrangement, the upper pole piece has considerable weight and must be supported. It is convenient to have strong and substantially stiff support posts between the pole pieces. It is desirable to have the posts confined to as narrow an angular region as possible to enhance the openness of the scanner. Narrow posts, however, are prone to vibration, which in turn affects imaging.

In higher field magnet systems, such as 0.7 Tesla (T) and above, vibration of support posts may be detected during imaging with a fast spin echo sequence. The effect is caused by the periodic application of imaging gradients that produce a resonance with the mechanical systems of the MRI system. As the support posts bend slightly, the magnetic field in the imaging volume is perturbed.

What is needed is a magnet arrangement for open MRI systems that reduces vibrations that affect imaging while maintaining the desirable openness of such systems.

SUMMARY OF INVENTION

In a first aspect, a magnet assembly system for use in an open Magnetic Resonance Imaging (MRI) system is provided and comprises a first assembly and a second assembly opposing each other in a longitudinally spaced apart relationship. The first and second assemblies generate a static magnetic field for use in imaging. Further provided is a plurality of support posts attached between the first and second assemblies for maintaining an open imaging volume between the first and second assemblies and for further providing structural support. Each of the support posts comprises a first support element and a second support element attached to first support element on the surface away from the imaging volume.

In a second aspect, a method for reducing vibration in an open MRI system is provided and comprises attaching a second support element to each of the support posts on a surface away from the imaging volume.

BRIEF DESCRIPTION OF DRAWINGS

The features and advantages of the present invention will become apparent from the following detailed description of the invention when read with the accompanying drawings in which.

DETAILED DESCRIPTION

Figure 1:
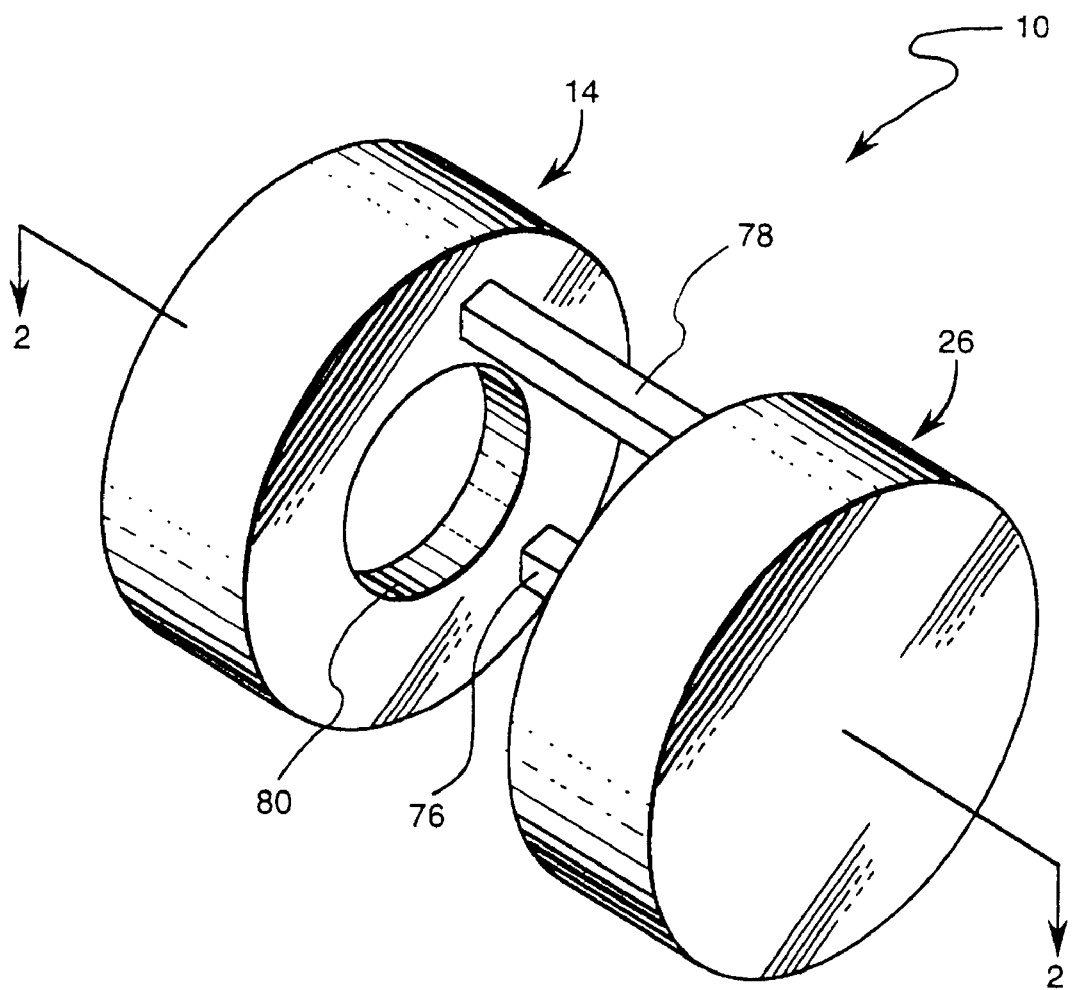
FIG. 1 is a schematic perspective view of an embodiment of the magnet of the invention.
Figure 2:
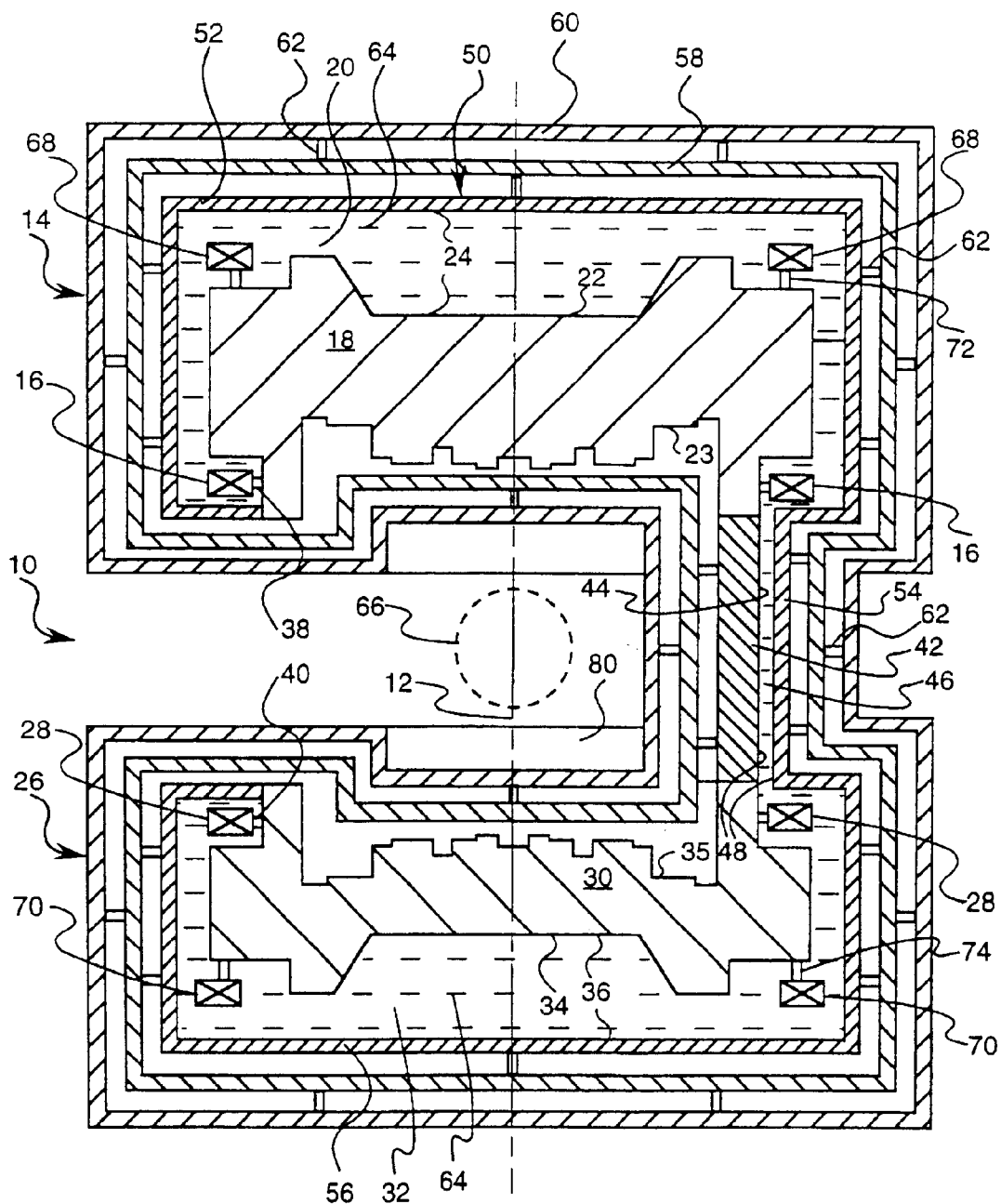
FIG. 2 is a schematic cross sectional view of the magnet of FIG. 1 taken along lines 2—2 of FIG. 1; and, FIG. 3 is a schematic cross-sectional view of a support post to which embodiments of the present invention are applicable.

Referring now to the drawings, wherein like numerals represent like elements throughout, FIGS. 1–2 show an embodiment of the magnet 10 of the present invention. In one application, magnet 10 provides the static magnetic field for a magnetic resonance imaging (MRI) system (not shown) used in medical diagnostics. It is noted that in describing the invention, when a magnet is said to include a component such as a coil, a pole piece, or a dewar, etc., it is understood to mean that the magnet includes at least one coil, at least one pole piece, or at least one dewar, etc.

In a first embodiment, a superconductive magnet 10 includes a longitudinally-extending axis 12 and a first assembly 14. The first assembly 14 includes a superconductive main coil 16 and a magnetizable pole piece 18. The main coil 16 is generally coaxially aligned with the axis 12, carries a first main electric current in a first direction, and is disposed a first radial distance from the axis 12. The first direction is defined to be either a clockwise or a counter-clockwise circumferential direction about the axis 12 with any slight longitudinal component of current being ignored. The pole piece 18 is generally coaxially aligned with the axis 12, and is spaced apart from the main coil 16 of the first assembly 14. Most of the pole piece 18 of the first assembly 14 is disposed radially inward of the main coil 16 of the first assembly 14. The pole piece 18 of the first assembly 14 extends from the axis 12 radially outward a distance equal to at least 75 percent of the first radial distance. During operation of the magnet 10, the pole piece 18 of the first assembly 14 has a temperature equal generally to that of the main coil 16 of the first assembly 14. It is noted that the first assembly 14 may be used alone as a table magnet (not shown) or may be one of two assemblies of an open magnet (as shown in the figures). During operation of the magnet 10, the main coil 16 and the pole piece 18 of the first assembly 14 are cooled by a cryocooler coldhead (not shown), and/or by a cryogenic fluid, or the like.

In a second embodiment, a superconductive magnet 10 includes a longitudinally-extending axis 12 and a first assembly 14. The first assembly 14 includes a superconductive main coil 16, a magnetizable pole piece 18, and a cryogenic-fluid dewar 20. The superconductive main coil 16 is generally coaxially aligned with the axis 12 and carries a first main electric current in a first direction. The pole piece 18 is generally coaxially aligned with the axis 12, is spaced apart from the main coil 16, has a surface portion 22. Most of the pole piece 18 is disposed radially inward of the main coil 16. The dewar 20 encloses the main coil 16 and has an interior surface 24 defined in part by the surface portion 22 of the pole piece 18.

In particular magnet designs, additional superconductive main coils (not shown) may be needed in the first assembly 14 to achieve a high magnetic field strength, within the magnet's imaging volume, without exceeding the critical current density of the superconductor being used in the superconductive coils, as is known to those skilled in the art. An example of a superconductor for the superconductive main coil 16 is niobium-titanium. An example of a material for the pole piece 18 is iron.

In one example, the magnet 10 also includes a second assembly 26 longitudinally spaced apart from the first assembly 14. The second assembly 26 includes a superconductive main coil 28, a magnetizable pole piece 30, and a cryogenic-fluid dewar 32. The superconductive main coil 28 is generally coaxially aligned with the axis 12 and carries a first main electric current in the previously-described first direction. The pole piece 30 is generally coaxially aligned with the axis 12, is spaced apart from the main coil 28, and has a surface portion 34. Most of the pole piece 30 is disposed radially inward of the main coil 28. The dewar 32 encloses the main coil 28 and has an interior surface 36 defined in part by the surface portion 34 of the pole piece 30. In the example shown in FIGS. 1 and 2, the pole piece 18 includes another surface portion 23 which does not help define the interior surface 24 of the dewar 20, and the pole piece 30 includes another surface portion 35 which does not help define the interior surface 36 of the dewar 32.

In one construction, the magnet 10 also includes a generally-nonmagnetizable coil support 38 attached to the pole piece 18 and supporting the main coil 16 of the first assembly 14 and further includes a generally-nonmagnetizable coil support 40 attached to the pole piece 30 and supporting the main coil 28 of the second assembly 26. By "nonmagnetizable" is meant being able to be magnetized no better than nonmagnetic stainless steel. An example of a material for the coil supports 38 and 40 is nonmagnetic stainless steel or fiberglass.

In one magnet design, the magnet 10 also includes a generally-nonmagnetizable (first) support post 42 having a first end structurally attached (e.g., welded) to the pole piece 18 of the first assembly 14, having a second end structurally attached (e.g., welded) to the pole piece 30 of the second assembly 26, and having a surface portion 44. An example of a material for the (first) support post 42 is nonmagnetic stainless steel. In this design, the magnet 10 further includes a (first) dewar conduit 46 in fluid communication with the dewar 20 of the first assembly 14 and the dewar 32 of the second assembly 26. The (first) dewar conduit 46 has an interior surface 48 defined in part by the surface portion 44 of the (first) support post 42. Here, a plate assembly 50 has an interior surface including a first portion 52 defining in part the interior surface of the dewar 20 of the first assembly 14, a second portion 54 defining in part the interior surface of the dewar 32 of the second assembly 26, and a third portion 56 defining in part the interior surface of the (first) dewar conduit 46. In this example, the magnet 10 additionally includes a thermal shield 58 and a vacuum vessel 60. The thermal shield 58 is spaced apart from and generally encloses the pole piece 18 and 30 and the dewar 20 and 32 of the first and second assemblies 14 and 26, the (first) support post 42, and the (first) dewar conduit 46. The vacuum vessel 60 is spaced apart from and hermetically encloses the thermal shield 58. An example of a material for the plate assembly 50, the thermal shield 58, and the vacuum vessel 60 is nonmagnetic stainless steel. It is noted that, in this example, the previously-mentioned "spacing apart" is accomplished by using conventional spacers 62.

In operation, the magnet 10 would include cryogenic fluid 64 disposed in the dewar 20 and 32 of the first and second assemblies 14 and 26 and in the (first) dewar conduit 46. An example of a cryogenic fluid is liquid helium. A cryocooler coldhead (not shown) may be used to recondense evaporated liquid helium by having the first stage of the coldhead be in contact with the thermal shield 58 and by having the second stage of the coldhead penetrate into the dewar void volume near the highest point of a dewar 20 and 32 In another embodiment (not shown) of the magnet of the invention, the first and second assemblies 14 and 26 each would have a self-contained dewar, thermal shield, and vacuum vessel wherein support posts would interconnect the vacuum vessels or wherein the two assemblies 14 and 26 would be supported in spaced-apart relationship by a "C"-shaped arm, by being bolted to a floor and/or walls, or by other means. In the embodiment not shown, the cryogenic fluid 64 would be disposed only in the dewar 20 and 32 of the first and second assemblies 14 and 26 since there would be no (first) dewar conduit 46. In the embodiment shown in FIGS. 1 and 2, the magnet 10 also includes a magnetic resonance imaging volume 66 having a center located generally on the axis 12 longitudinally equidistant between the first and second assemblies 14 and 26. One shape of the imaging volume 66 is a sphere. It is noted that typically the second assembly 26 is a general mirror image of the first assembly 14 about a plane (not sown) which is perpendicular to the axis 12 and which is disposed generally equidistant between the first and second assemblies 14 and 26.

In a third and exemplary embodiment, a superconductive open magnet 10 includes a longitudinally-extending axis 12, a first assembly 14, and a second assembly 26 longitudinally spaced apart from the first assembly 14. The first assembly 14 includes a superconductive main coil 16, a superconductive shielding coil 68, a magnetizable and generally cylindrical-shaped pole piece 18, and a cryogenic-fluid dewar 20. The superconductive main coil 16 is generally coaxially aligned with the axis 12 and carries a first main electric current in a first direction. The superconductive shielding coil 68 is generally coaxially aligned with the axis 12, is disposed longitudinally outward from the main coil 16, and carries a first shielding electric current in an opposite direction to the previously-described first direction. The pole piece 18 is generally coaxially aligned with and intersects the axis 12, is spaced apart from the main and shielding coils 16 and 68, and has a surface portion 22. Most of the pole piece 18 is disposed longitudinally between and radially inward of the main and shielding coils 16 and 68. The dewar 20 encloses the main and shielding coils 16 and 68 and has an interior surface 24 defined in part by the surface portion 22 of the pole piece 18. The second assembly 26 includes a superconductive main coil 28, a superconductive shielding coil 70, a magnetizable and generally cylindrical-shaped pole piece 30, and a cryogenic-fluid dewar 32. The superconductive main coil 28 is generally coaxially aligned with the axis 12 and carries a second main electric current in the previously-described first direction. The superconductive shielding coil 70 is generally coaxially aligned with the axis 12, is disposed longitudinally outward from the main coil 28, and carries a second shielding electric current in the previously-described opposite direction. The pole piece 30 is generally coaxially aligned with and intersects the axis 12, is spaced apart from the main and shielding coils 28 and 70, and has a surface portion 34. Most of the pole piece 30 is disposed longitudinally between and radially inward of the main and shielding coils 28 and 70. The dewar 32 encloses the main and shielding coils 28 and 70 and has an interior surface 36 defined in part by the surface portion 34 of the pole piece 30.

In one construction, the open magnet 10 also includes generally-nonmagnetizable coil supports 38 and 72 attached to the pole piece 18 and supporting the main and shielding coils 16 and 68 of the first assembly 14 and further includes generally-nonmagnetizable coil supports 40 and 74 attached to the pole piece 30 and supporting the main and shielding coils 28 and 70 of the second assembly 26. In one magnet design, the open magnet 10 also includes generally-nonmagnetizable first 42 and second (not shown but identical with the first 42) support posts each having a first end structurally attached to the pole piece 18 of the first assembly 14, each having a second end structurally attached to the pole piece 30 of the second assembly 26, and each having a surface portion 44. In this design, the open magnet 10 further includes first 46 and second (not shown but identical with the first 46) dewar conduits each in fluid communication with the dewar 20 of the first assembly 14 and the dewar 32 of the second assembly 26. The first dewar conduit 46 has an interior surface 48 defined in part by the surface portion 44 of the first support post 42, and the second dewar conduit has an interior surface defined in part by the surface portion of the second support post. In this example, the open magnet 10 additionally includes a thermal shield 58 and a vacuum vessel 60. The thermal shield 58 is spaced apart from and generally encloses the pole piece 18 and 30 and the dewar 20 and 32 of the first and second assemblies 14 and 26, the first 42 and second support posts, and the first 46 and second dewar conduits. The vacuum vessel 60 is spaced apart from and hermetically encloses the thermal shield 58. It is noted that the first support post 42 and the first dewar conduit 46 are disposed inside a first portion 76 of the vacuum vessel 60, that the second support post and the second dewar conduit are disposed inside a second portion 78 of the vacuum vessel, and that such first and second portions 76 and 78 of the vacuum vessel 60 are shown in FIG. 1. In operation, the magnet 10 would include the previously-described cryogenic fluid 64 and magnetic resonance imaging volume (also known as just "imaging volume") 66. In one construction, the first 42 and second support posts (as seen from the enclosing first and second portions 76 and 78 of the vacuum vessel 60 shown in FIG. 1) are angularly spaced apart between generally 110 and 150 degrees about the axis 12 and disposed radially outward from the imaging volume 66. In one example an angular spacing of generally 130 degrees is provided for convenient placement of the patient (not shown) in the imaging volume 66.

In one application, the open magnet 10 has a magnetic field within its imaging volume 66 of generally 1.4 to 1.5 Tesla. In one orientation of the open magnet 10, the first and second portions 76 and 78 of the vacuum vessel 60 are horizontally aligned (as shown in FIG. 1), and the patient would typically be in a standing position within the imaging volume 66. In another orientation (not shown) of the open magnet 10, the first and second portions 76 and 78 of the vacuum vessel 60 are vertically aligned, and the patient would typically be lying on a patient table within the imaging volume 66. It is noted that the pole pieces 18 and 30 provide the main structural support of the magnet 10 including the coils 16, 28, 68, and 70 and the dewars 20 and 32, and that the pole pieces 18 and 30 are shaped (e.g., have ring steps) to provide a more uniform magnetic field within the imaging volume 66. Any further correction of magnetic field inhomogeneities may be accomplished by active shimming, as is within the skill of the artisan. It is further noted that in the example shown in the figures, magnet 10 is designed for each assembly 14 and 26 to have a recess 80 in the vacuum vessel 60 facing the imaging volume 66 for a split pair of flat shielded gradient/RF coils, wherein the pole faces of the pole pieces 18 and 30 are not laminated, as can be appreciated by the artisan.

Figure 3:
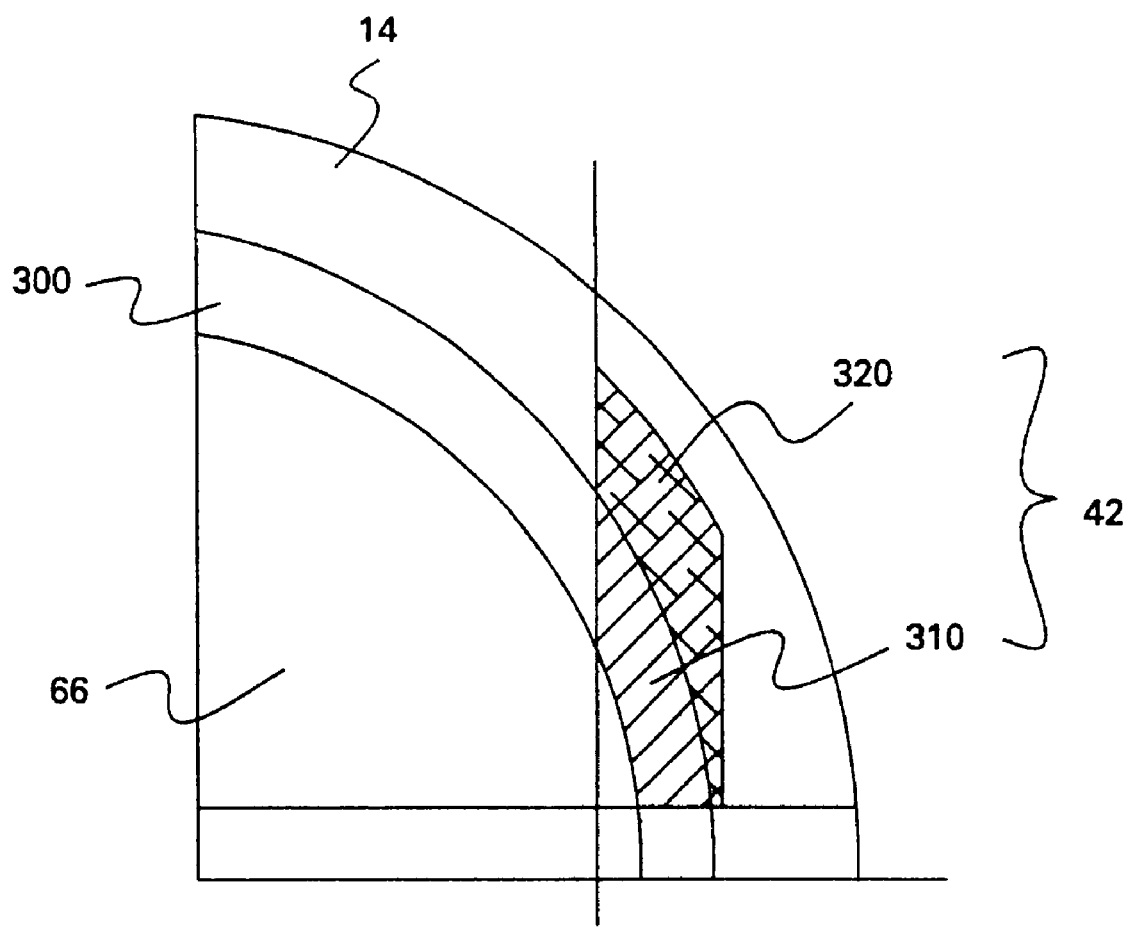

Referring now to FIG. 3, there is shown a cross-sectional view of an embodiment of a support post configuration to which embodiments of the present invention are applicable. In this embodiment, an alternative embodiment is provided for the support posts (shown as first support post 42 in FIG. 1 and a second support post is not in view but identical to first support post) of the open magnet system. Referring further to FIG. 3, the magnet assembly system of FIG. 1 comprises a first assembly 14 and a second assembly 26 opposing each other in a longitudinally spaced apart relationship. The first and second assemblies generating a static magnetic field for use in MR imaging. FIG. 3 shows first assembly 14 only, but it is appreciated that second assembly 26 is identical. On a surface of first assembly 14 (and on an opposing surface of second assembly 26), there is typically a ring 300 to which components such as support post 42 is mounted thereon. Ring 300 is typically on the outer surface of first assembly 14 and second assembly 26, and is on the surface facing the imaging volume 66. The magnet system further comprises support post 42 (and a second post not shown in the cross-sectional view of FIG. 3). In an embodiment of the present invention, support post 42 comprises a first support element 310, which is a support post such as described with reference to FIGS. 1 and 2, and a second support element 320 attached to first support element 310 on the surface away from imaging volume 66 (hereinafter referred to as the "back"). In the embodiment shown in FIG. 3, second support element 320 and first support element 310 form support post 42. Second support element 320 may be welded to first support element 310 and further welded, or similarly attached, to ring 300 for added support. It is to be appreciated that this embodiment is useful for modifying existing open MRI systems in order to reduce vibration.

The support posts as described above are configured to reduce vibration. The curvature I/R induced by a bending moment M on a support post depends on the moment of inertia of the cross section I and on the modulus of elasticity E given by the equation M=EI/R. In the high field open geometry, the bending of the support post deflects the top magnetic pole by the angle θ (theta) that creates magnetic field variation detected in imaging. Since the support post neutral axis is a distance off center (30 cm in a typical configuration), the angle influences the vibration amplitude of the center distance between the gap between first and second assemblies 14 and 26, respectfully. The length of post d, the radius of curvature E and the angle are related by d=Rθ. By employing the support structure of FIG. 3, the additional material of second support element 320 displaces the exterior post boundary toward the back on the MRI system along the y-direction. Torque on the poles by the applied imaging gradient bends the post and the moment of inertia of the magnetic poles and the spring constant of the post gives a 30 Hz resonance. This increases the moment of inertia by a factor of 10 and stiffens the post. Additionally, this raises the resonance frequency and reduces the amplitude of vibration.

An embodiment for a method for reducing vibration in open MRI comprises attaching a second support element to each of the support posts on a surface away from the imaging volume as described above. It is to be appreciated that this method may be applicable for existing open MRI systems as a modification for reducing vibration and vibration effects.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A magnet assembly system for use in an open Magnetic Resonance Imaging (MRI) system comprising:

a first assembly and a second assembly opposing each other in a longitudinally spaced apart relationship, the first and second assemblies being for generating a static magnetic field;

a plurality of support posts attached between the first and second assemblies for maintaining an open imaging volume between the first and second assemblies and for further providing structural support, each of the support posts comprising a first support element and a second support element attached to first support element on the surface away from the imaging volume.

2. The system of claim 1 wherein the second support element displaces an exterior post boundary toward the back on the MRI system along the y-direction.

3. The system of claim 1 wherein each of the plurality of support posts is configured to reduce vibration.

4. The system of claim 1 wherein the MRI system is a high field open MRI system.

5. The system of claim 1 wherein the first and second assemblies each comprise a magnet coil, a pole piece and a dewar.

6. A method for reducing vibration for use in an open MRI system having a pair of opposing assemblies for generating a static magnetic field and a plurality of support posts, said plurality of support posts comprising a plurality of first support elements, said plurality of support posts providing structural support and for maintaining an open imaging volume between the pair of assemblies, the method comprising:

attaching a second support element to each of said plurality of first support elements on a surface away from the imaging volume.

7. The method of claim 6 wherein the MRI system is a high field open MRI system.

8. The method of claim 6 wherein each of the pair of opposing assemblies comprise a magnet coil, a pole piece and dewar.

9. The method of claim 6 wherein the second support element displaces an exterior post boundary toward the back on the MRI system along the y-direction.

10. The method of claim 6 wherein the second support element is adapted to stiffen the support post and reduce vibration of the support post during imaging.

* * * * *